(12) United States Patent
Peschl

(10) Patent No.: US 8,499,824 B2
(45) Date of Patent: Aug. 6, 2013

(54) HEAT SINK

(75) Inventor: Hans Peter Peschl, Hart/Graz (AT)

(73) Assignee: Elektronische Bauelemente Gesellschaft m.b.H., Ligist (AT)

( * ) Notice: Subject to any disclaimer, the term of this patent is extended or adjusted under 35 U.S.C. 154(b) by 1690 days.

(21) Appl. No.: 11/243,287

(22) Filed: Oct. 4, 2005

(65) Prior Publication Data

US 2007/0074850 A1    Apr. 5, 2007

(51) Int. Cl.
*H05K 7/20* (2006.01)

(52) U.S. Cl.
USPC ............ 165/78; 165/80.3; 165/185; 257/722; 361/704

(58) Field of Classification Search
USPC ........... 165/78, 80.3, 185; 257/722; 361/704
See application file for complete search history.

(56) References Cited

U.S. PATENT DOCUMENTS

| | | | | |
|---|---|---|---|---|
| 4,266,156 A | * | 5/1981 | Kizaki | 310/344 |
| 4,327,311 A | * | 4/1982 | Wroblewski | 315/244 |
| 5,014,776 A | * | 5/1991 | Hess | 165/185 |
| 5,682,948 A | * | 11/1997 | Bock | 165/185 |
| 5,709,263 A | * | 1/1998 | Mira | 165/80.3 |
| 5,905,627 A | * | 5/1999 | Brendel et al. | 361/302 |
| 6,493,227 B2 | * | 12/2002 | Nielsen et al. | 165/185 |
| 6,500,694 B1 | * | 12/2002 | Enquist | 438/109 |
| 6,520,248 B2 | * | 2/2003 | Gailus et al. | 165/80.3 |
| 7,188,661 B2 | * | 3/2007 | Mathews et al. | 165/80.3 |

FOREIGN PATENT DOCUMENTS

| | | | |
|---|---|---|---|
| EP | 483058 A1 | * | 4/1992 |
| EP | 623952 A1 | * | 11/1994 |
| EP | 795905 A2 | * | 9/1997 |

\* cited by examiner

*Primary Examiner* — Leonard R Leo
(74) *Attorney, Agent, or Firm* — Coats and Bennett, PLLC

(57) ABSTRACT

A heat sink assembly comprises a base having one or more slots, and further comprises one or more fins, each having an end configured for insertion into a respective one of the slots. Each fin end has a first surface that is configured for conformally engaging a first slot sidewall for good thermal conduction from the base into the fin, and has a second surface configured for cold welding to a second slot sidewall for good mechanical fastening of the fin to the base. The combined thermal bonding and cold-welding engagement are produced by pressing the fin ends of the fins into the base slots at a controlled pressing rate. Further, leading and/or trailing edges of the fins may be beveled to improve airflow directed edgewise across the fins.

21 Claims, 10 Drawing Sheets

HEAT SINK

BACKGROUND OF THE INVENTION

The present invention relates to heat sinks, and particularly relates to convection heat sinks, such as may be used for semiconductor cooling.

Heat sinks are widely used to enhance the removal of heat energy from various types of electronic components. For example, heat sinks are pervasively used to cool semiconductor devices such as microprocessors, memory circuits, lasers, charge-coupled devices, and power electronics such as insulated gate bipolar transistors (IGBTs), etc.

Selection of an appropriate heat sink is determined by the specific thermal load to be dissipated. The chosen heat sink must withstand the maximum heat load applied by the component to be cooled while not exceeding the maximum temperature specified by the component supplier/manufacturer. Various classes of heat sinks are available depending on the thermal load requirements. For example, convection heat sinks (both natural and forced air), liquid cooled heat sinks and heat pipe systems are all available. Convection heat sinks are widely used in applications requiring 26 W/in.$^2$ or less of heat dissipating capability (i.e., heat flux). Liquid cooled heat sinks are widely used in applications requiring 40 to 480 W/in.$^2$ of heat dissipating capability. Heat pipes are widely used in applications requiring up to 600 W/in.$^2$ of heat dissipating capability.

Convection heat sinks, such as forced air heat sinks, are preferred in applications requiring 26 W/in.$^2$ or less of heat dissipating capability because of their cost effectiveness and reliability. However, the actual cost effectiveness and operating performance of convection heat sinks depends on a potentially complex set of variables, including heat sink material selection and base/fin fabrication details.

In a common convection-based heat sink configuration, the heat sink comprises a base and one or more outwardly extending fins. For example, one side of a flat base can be used to attach the device to be cooled, such as a power transistor device, with the other side of the base having some number of outwardly projecting fins to increase the surface area of the heat sink.

Assuming good thermal bonding between the base and the device to be cooled, good thermal performance of the overall heat sink depends on having low thermal impedances between the base and its fins. That is, the fins' ability to dissipate heat flowing into the base from the device to be cooled depends on maintaining good thermal conductance through the base into each fin. Different base/fin fabrication techniques offer a mix of compromises and advantages regarding thermal performance, overall cost, complexity, and manufacturability.

For example, extrusion allows formation of a heat sink base with integral fins. Extruding the heat sink as a single piece offers excellent thermal conduction from the base into each fin, because each fin represents a continuous extension of the base material. However, the overall thermal performance of one-piece extruded heat sinks of this type is limited by practical manufacturing considerations. Namely, the practical fin height is limited by extrusion limitations, such as the fin height-to-thickness aspect ratio (e.g., 20:1 maximum). Typical fin height-to-thickness aspect ratios of up to 6:1 and a minimum fin thickness of 1.3 mm are attainable with a standard extrusion process. An aspect ratio of 10:1 and a fin thickness of 0.8" can be achieved with special die design features. However, increasing the aspect ratio compromises extrusion tolerances.

Practical manufacturing considerations of this sort generally limit the thermal performance of one-piece extruded heat sinks to heat dissipation to less than 12 W/in.$^2$ maximum. Fabricating the base and fins as separate elements eliminates the extrusion-related fin height limitations inherent in the one-piece design. However, the two-piece approach presents the two-fold challenge of establishing good thermal conduction at the base-fin connections while maintaining requisite base-fin mechanical strength.

Employing a "conical press fit" method for securing the fins to the base offers relatively good thermal performance (in the range of 26 W/in.$^2$), while simultaneously offering good mechanical performance. However, because the process relies on press fitting each fin into a "coned" aperture in the base, the fin insertion depth needed to securely seat each fin varies with fin and aperture dimension tolerances. Variations in the insertion depth translate into variations in seated fin height and generally, which requires the additional manufacturing step of cutting the fins down to a uniform, finished height. Overall, the precision and finishing required in this process makes it relatively expensive in comparison to other methods.

Bonding fins to the base rather than press fitting effectively eliminates the height variation problem, offers decent thermal performance (in the range of 24 W/in.$^2$), and can reduce costs. Commonly, bonded heat sinks use thermally conductive aluminum-filled epoxy to bond planar fins onto a grooved extrusion base plate. This process allows for a much greater fin height-to-thickness aspect ratio of 20:1 to 40:1, which increases the cooling capacity without increasing volume requirements. However, thermal performance is heavily dependent on the bonding material, which itself can be expensive, and trade-offs exist between the thermal and mechanical performance of the bonding material.

Another two-piece alternative overcomes some of the limitations of both conical-press-fitting and epoxy bonding. This alternative uses "two-sided cold welding" to connect each fin to the base. One end of each fin includes ridges that are oversized relative to the insertion apertures of the base, so that inserting the fin into the aperture produces cold-welding on both sides of the inserted end of the fin. While this process produces good mechanical bonding, the irregular (non-conformal) contact between fin and base caused by the cold-welding ridges limits the thermal performance (in the range of 25-26 W/in.$^2$).

Other processes exist, such as the use of a continuous sheet or plate "folded" into a series of fins, where the folded fin assembly is then attached to a base, or is otherwise bonded to the device to be cooled. However, folded fin assemblies generally suffer significant pressure drop in forced air convection applications, and do not offer good natural convection, leading to potentially serious problems in the event of fan failure.

On that point, airflow performance generally stands as a further complicating aspect of achieving good thermal performance in convection-based heat sinks, folded or otherwise. As a general proposition in forced air heat sinks, airflow must be ducted into the heat sink with sufficient velocity and volume to achieve good thermal performance. The ability of a fan to move high volumes of air is a function of pressure drop. As pressure increases, airflow decreases. Thus, reducing pressure drop in the heat sink assembly represents one approach to gaining significantly improved thermal performance. Of course, other factors, such as flow turbulence come into play as well.

With these complexities in mind, it will be appreciated that building a high performance heat sink represents a rather complicated design challenge. To meet that challenge, heat sink designers and fabricators must artfully balance cost and manufacturability against thermal and mechanical performance requirements.

SUMMARY OF THE INVENTION

The methods and apparatus taught herein provide a heat sink manufacturing and assembly process offering low manufacturing costs and yielding a heat sink with high thermal and mechanical performance. According to one embodiment, a heat sink assembly comprises a base having a slot and a fin. The slot has first and second sidewalls and the fin has an end adapted for insertion in the slot, wherein the fin end comprises a first surface configured to conformally engage the first sidewall during insertion for thermal bonding and a second surface having one or more protrusions configured to cold-weld to the second sidewall during insertion for mechanical fastening. As used herein, and unless otherwise noted, the term "conformally engage" implies a contoured surface-to-surface contact between adjacent objects.

In another embodiment, a heat sink comprises a base having a slot and a fin, the slot having first and second sidewalls, and the fin having an end inserted in the slot. The fin end of the fin comprises a first surface conformally engaged with the first sidewall for thermal bonding and a second surface having one or more protrusions, the one or more protrusions cold-welded to the second sidewall for mechanical fastening.

According to another embodiment, a heat sink assembly method comprises forming a slot in a heat sink base, the slot having first and second sidewalls, forming an end on a heat sink fin separate from the heat sink base, the fin end having a first surface for thermally bonding to the first sidewall and a second surface having one or more protrusions for mechanical fastening to the second sidewall. The method continues with inserting the fin end in the slot at a controlled pressing rate to conformally engage the first surface of the fin end with the first sidewall and cold weld the second surface of the fin end with the second sidewall.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
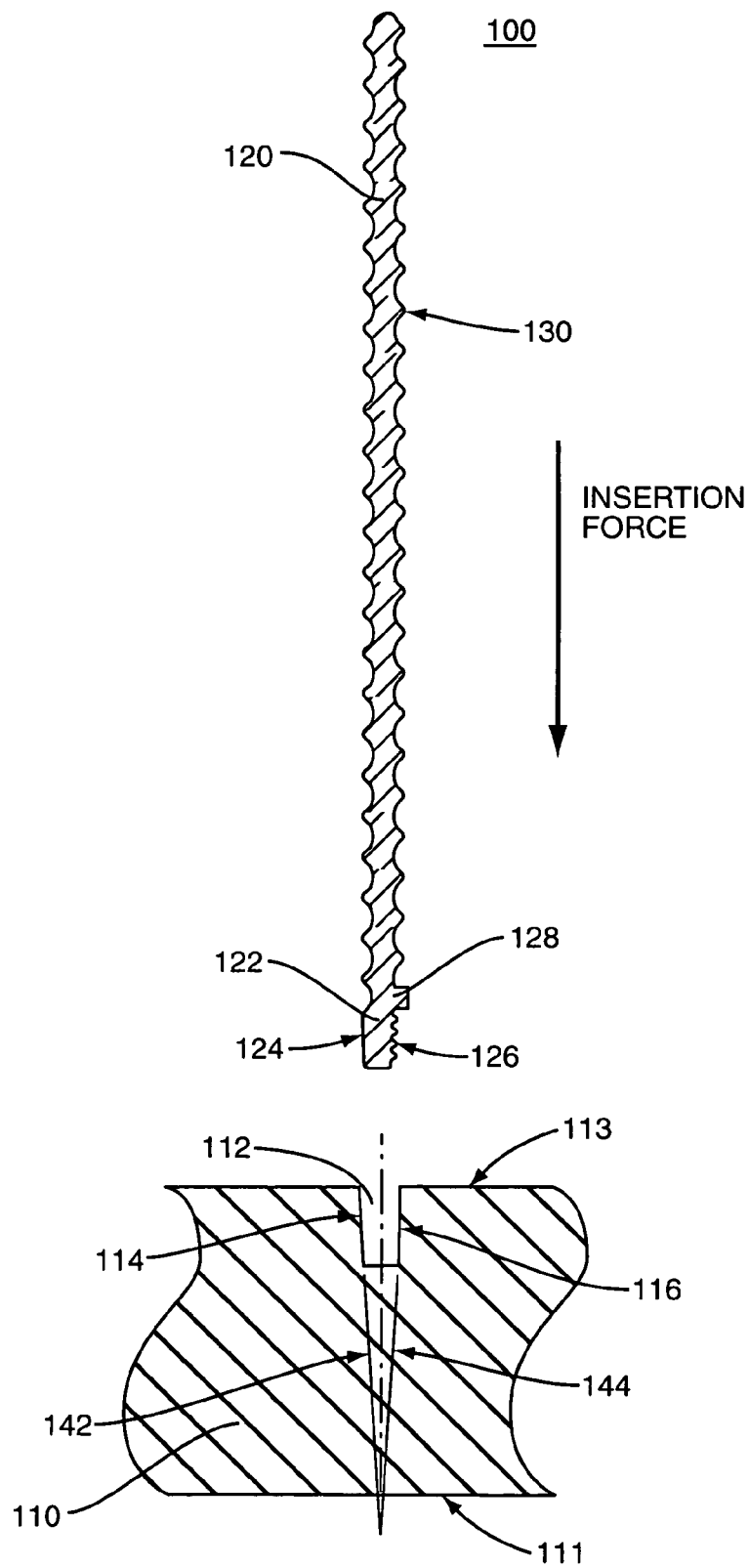
FIG. 1 is a diagram of one embodiment of a heat sink assembly.

FIG. 1 illustrates in a partial cross-sectional view components comprising one embodiment of a low-cost, high thermal performance convection heat sink assembly as taught herein. The heat sink assembly 100 comprises the base 110 and the fin 120. The base 110 and the fin 120 can comprise any material having suitable thermal conductivity such as aluminum, copper, silver, or any suitable alloy or combination thereof. Preferably, the base 110 and the fin 120 comprise an aluminum alloy such as AlMgSiO5, and may be advantageously formed using an extrusion process.

The base 110 is configured to dissipate heat from an electronic component (not shown) when the electronic component is in contact with the lower surface 111 of the base. The fin 120 is configured to dissipate heat from the base 110 when the fin is inserted into the base. The base 110 includes a slot 112 formed therein for receiving the fin 120. The slot 112 extends upward toward an upper surface 113 of the base 110 and is configured to receive the fin 120 upon forcible insertion of the fin into the slot. The slot 112 includes a first sidewall 114 and a second sidewall 116.

The fin 120 includes an end 122 configured for insertion into slot 112. The fin end 122 includes a first surface 124 and a second surface 126. The first surface 124 of the fin end 122 is configured such that the first surface conformally engages the first sidewall 114 of the slot 112 upon forcible insertion of the fin 120 into the slot 112. That is, the first surface 124 is of substantially the same shape, or contour, as the first sidewall 114 so as to maximize the extent of direct surface-to-surface contact.

For example, the first surface 124 is planar if the first sidewall 114 is planar. Alternatively, the first surface 124 has the same curvature as the first sidewall 114 if the first sidewall is curved. In general, the first surface 124 of the fin end 122 and the first sidewall 114 of the slot 112 comprise generally smooth surfaces adapted to mate together in close contact (e.g., "zero air gap") upon forced insertion of the fin 120 into the slot 112. Thus, upon such insertion, substantially all of the first surface 124 is conformally engaged, or in contoured surface-to-surface contact with, substantially all of the first sidewall 114, forming a low thermal impedance bond.

Preferably, the first surface 124 is in direct metallic contact with substantially all of the first sidewall 114. That is, the first surface 124 and the first sidewall 114 have been sufficiently smoothed by the forcible insertion of the fin into the slot such that the first surface and the first sidewall are substantially free of non-metallic films such as oxide. The conformity of the first surface 124 to the first sidewall 114 provides a superior thermal bond between the first surface and first sidewall as compared to a cold-welded mating, where the thermal contact area between the cold-welded surfaces is approximately 50% or less for the fin end/sidewall surface interfaces.

However, with the excellent thermal bonding between the first surface 124 and the first sidewall 114, the heat sink assembly 100 makes advantageous use of cold-welding between the second surface 126 of the fin end 122 and the second sidewall 116. The second surface 126 is configured to have one or more protrusions that cold-weld to the second sidewall 116 upon forcible insertion of the fin into the slot. Preferably, the protrusions comprise ridges or ribs formed along the exterior of the second surface. Alternatively, the protrusions may comprise other formations suitable for cold-welding such as cones, columns, rods, pins, bumps, or the like, or any suitable combination thereof.

With the above configuration, the heat sink assembly 100 offers a good combination of thermal and mechanical performance, while simultaneously offering simplified, low-cost manufacturing. More particularly, with the configuration of the fin end 122 and the slot 112, a controlled pressing of the fin 120 into the slot 112 produces a conformal thermal bond between the first surface 124 and the first sidewall 114 and a mechanical fastening (cold welding) of the second surface 126 to the second sidewall 116.

Thus, the heat sink assembly and heat sink of the present invention provides optimal thermal bonding between the fin and heat sink base at a first fin end/slot sidewall interface while providing a good mechanical engagement at the opposing fin end/slot sidewall interface. Upon forcible insertion of the fin 120 into the slot 112, approximately two-thirds of the thermal load will pass through the interface formed between the first sidewall 114 and the first surface 124. The remaining one-third of the thermal load will pass through the cold weld formed between the second sidewall 116 and the protrusions extending from the second surface 126.

Optionally, a body portion of the fin 120 can include surface features, such as protrusions 130, for increasing the surface area of the fin. By increasing the surface area of the fin 120, the thermal dissipation capacity of the fin is increased. The surface features can be of any suitable pattern such as ridges, ribs, arcs, cones, columns, rods, pins, or the like, or any suitable combination thereof.

Additionally, one or both of the sidewalls of the slot 112 can be tapered. In general, the first and second sidewalls are at first and second angles relative to a plane of the base, and the first and second surfaces of the fin's end are at substantially matching angles. For example, first sidewall 114 can be tapered at an angle 142 or can be perpendicular to the base 110 and second sidewall 116 can be tapered at an angle 144 or can be perpendicular to the base 110. Preferably, one or both of sidewalls 114 and 116 are tapered at approximately 2 to 5 degrees or more beyond perpendicular to the base. To ensure proper forcible insertion of the fin 120 into the slot 112, the corresponding surfaces of the fin end 122 are configured at angles substantially equivalent to the sidewall angles. That is, the first surface 124 is configured at substantially the same angle as the first sidewall 114 and the second surface 126 is configured at substantially the same angle as the second sidewall 116.

Optionally, the fin 120 may further comprise a mechanical stop 128. The mechanical stop 128 limits the insertion depth of the fin 120 into the slot 112. That is, the fin 120 may be forcibly inserted into the slot 112 until the mechanical stop 128 contacts the upper surface 113 of the base 110. The mechanical stop 128 limits the fin insertion depth and yields substantially uniform fin heights for a plurality of fins respectively inserted into corresponding slots formed in the base. The ability to achieve uniform fin height after seating, or fin insertion, eliminates the need for machining inserted fins to a uniform height and thus lowers manufacturing costs.

Figure 2:
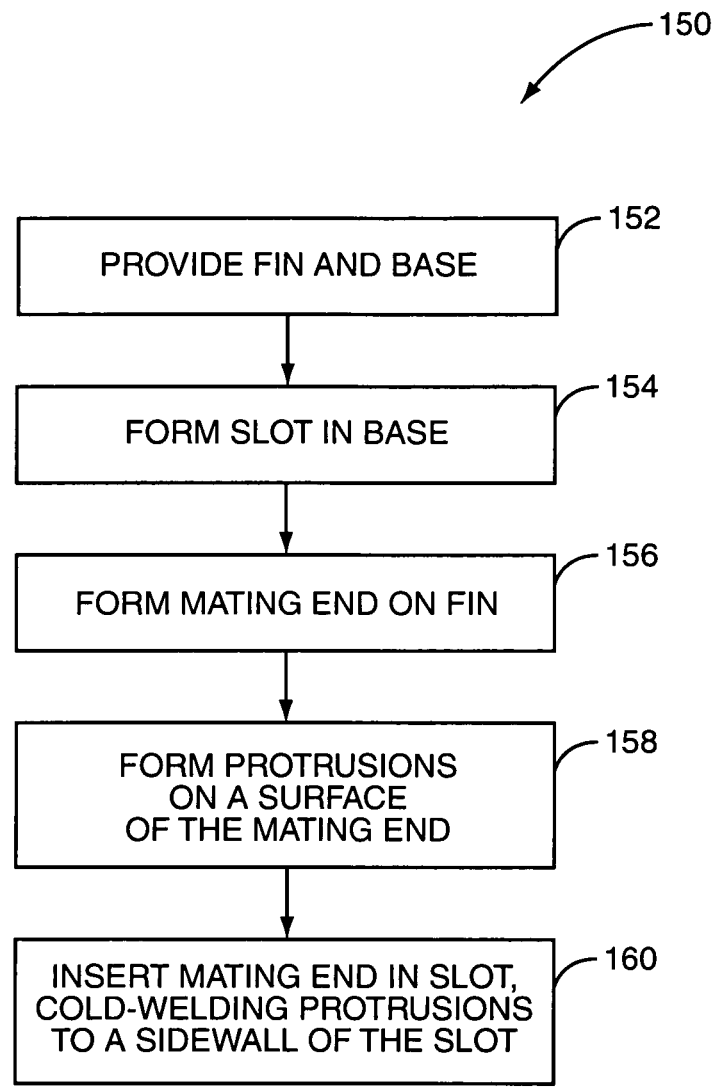
FIG. 2 is a logic flow diagram of one embodiment of a heat sink assembly method.

FIG. 2 illustrates an embodiment of the heat sink assembly method taught herein for assembling a heat sink from the heat sink assembly 100 of FIG. 1. It should be understood that the illustrated process does not limit the assembly method to a particular sequence or order of steps. Thus, the illustrated order may be changed or otherwise modified, and some steps may be combined.

With that in mind, a heat sink base and fin are provided (Step 152). For example, the base and fin can comprise any material having suitable thermal conductivity such as aluminum, copper, silver, or any suitable alloy or combination thereof. Preferably, the base and fin comprise extruded pieces made from AlMgSiO5 as previously described. A slot having first and second sidewalls is formed in the base (Step 154). One or both of the slot sidewalls can be formed perpendicular to the base or can be formed at any suitable angle obtuse to the base.

A fin end with first and second surfaces is formed on the fin for insertion into the slot (Step 156). To ensure proper forced insertion of the fin into slot, the fin end surfaces are configured at angles substantially equivalent to the corresponding sidewall angles as previously described. Further, to cause cold welding upon forced insertion, protrusions are formed on the second fin end surface (Step 158). Note that the protrusions may be formed in conjunction with forming the fin itself and, in general, the base and fin may be provided with the slot and fin end preformed.

In any case, the end of the fin is forcibly inserted into the slot at a controlled pressing rate (Step 160). Preferably, the fin is inserted into the slot at a constant pressing rate of approximately 0.3 inches/second for extruded aluminum fins and bases. The pressing rate is a function of the composition of the fin and base, and those skilled in the art will appreciate that the actual pressing rate can be adapted as needed or desired.

With use of a suitable pressing rate, a metal alloy interaction takes place between the protrusions on the fin end of the second surface and the second sidewall of the slot during forcible insertion of the fin into the slot. During insertion, an alumina skin overlying the second sidewall is removed in those regions contacted by the protrusions. Removal of this alumina skin enables atomic convergence to occur where the protrusions contact the second sidewall. Friction between the protrusions and the second sidewall that occurs during insertion disturbs the crystalline lattice of both the protrusions and the sidewall where the insertion contact occurs. The disturbed crystal lattices are incomplete and have free valence electrons. These free valence electrons result in reconnection, or cold-bonding, between the contacting metallic surfaces.

In general, a sufficient pressure must exist between the fin end surfaces and the slot sidewalls to maintain a cold-weld. Preferably, a partial pressure of at least 250 N/mm2 (35.000 lbs./in.2) is maintained at the protrusion/second sidewall interface. Such a partial pressure will ensure that the cold-weld will be maintained and thus provide sufficient mechanical fastening between the fin and base of the heat sink. The protrusions of the second fin end interface are designed as previously described such that substantially all pressure is concentrated to the protrusion/second sidewall interface. Thus, forcible insertion of the fin into the slot according to the above method causes the first surface of the fin's end to conformally engage the first sidewall of the base slot and causes the second surface of the fin's end to cold-weld with the second sidewall of the base slot.

Figure 3:
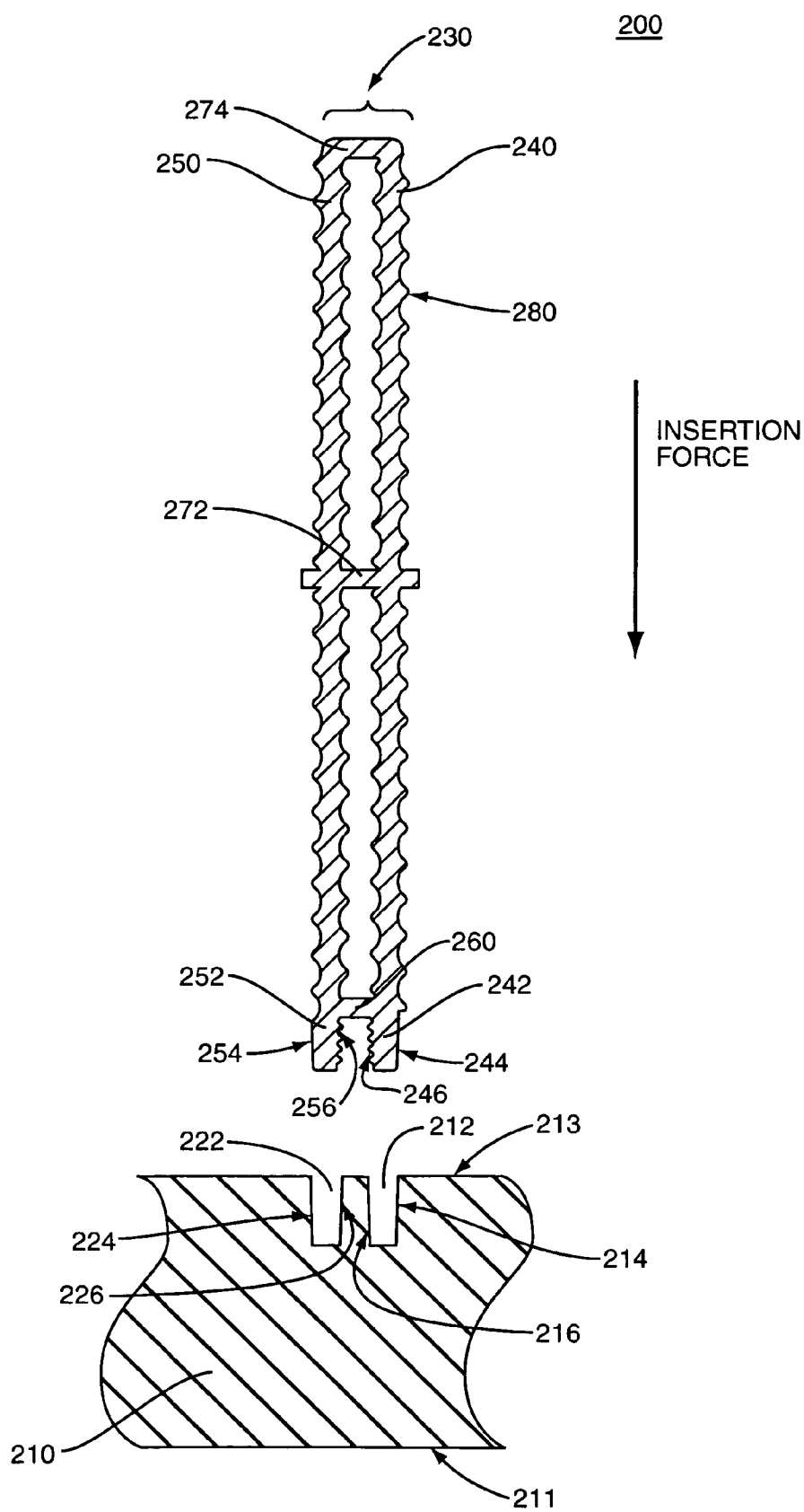
FIG. 3 is a diagram of another embodiment of a heat sink assembly.

FIG. 3 illustrates a partial cross-sectional view of another heat sink assembly embodiment. The heat sink assembly 200 is substantially similar in form and identical in function to the heat sink assembly 100 of FIG. 1, except that the heat sink assembly 200 comprises a double heat sink fin 230. The thermal bond and cold-weld engagement mechanisms of the heat sink assembly 100 as previously described are the same for the heat sink assembly 200, however, the heat sink assembly 200 comprises a thermal bond and cold-weld engagement mechanism for both a first heat sink fin 240 and a second heat sink fin 250 of the double fin 230. The fin end/sidewall interfaces as previously described in accordance with FIG. 1 are the same for the first fin 240 and the second fin 250.

The heat sink assembly 200 comprises a base 210 and the double fin 230. The base 210 and the double fin 230 can comprise any material having suitable thermal conductivity as previously described. The base 210 is configured to dissipate heat from an electronic component (not shown) coupled to a lower surface 211 of the base and the double fin 230 is configured to dissipate heat from the base, both as previously described.

The base 210 includes a first slot 212 and a second slot 222 for receiving the double fin 230. The slots 212 and 222 extend upward toward an upper surface 213 of the base 210 and are configured to receive the double fin 230 upon forcible insertion of the double fin into the slots. The first slot 212 includes a first sidewall 214 and a second sidewall 216. The second slot 222 includes a first sidewall 224 and a second sidewall 226. The first heat sink fin 240 includes an end 242 configured for insertion into the first slot 212. The fin end 242 includes a first surface 244 and a second surface 246. The second heat sink fin 250 includes an end 252 configured for insertion into the second slot 222. The fin end 252 includes a first surface 254 and second a surface 256.

The first surface 244 of the first fin end 242 is configured such that the first surface conformally engages the first sidewall 214 of the first slot 212 upon forcible insertion of the double fin into the slots. That is, the first surface 244 of the first fin end 242 is of substantially the same shape, or contour, as the first sidewall 214 of the first slot 212. Additionally, the first surface 254 of the second fin end 252 is also configured such that the first surface conformally engages the first sidewall 224 of the second slot 222 upon forcible insertion of the double fin into the slots. That is, the first surface 254 of the second fin end 252 is of substantially the same shape, or contour, as the first sidewall 224 of the second slot 222.

Upon forcible insertion of the double fin 230 into the slots 212 and 222, substantially all of the first surface 244 of the first fin end 242 is in direct conformal contact with substantially all of the first sidewall 214 of the first slot 212. Additionally, substantially all of the first surface 254 of the second fin end 252 is in direct conformal contact with substantially all of the first sidewall 224 of the second slot 222. Preferably, each first fin end surface is in direct metallic contact with substantially all of the corresponding first sidewall as previously described, thus providing superior thermal bonding between each first fin end surface/first sidewall interface.

One or more protrusions extend from both the second surface 246 of the first fin end 242 and from the second surface 256 of the second fin end 252, respectively. The protrusions of the first and second fin ends 242 and 252 are configured as previously described such that they cold-weld to the corresponding second sidewalls 216 and 226, respectively, upon forcible insertion of the double fin 230 into the slots 212 and 222. The protrusions can comprise any suitable shape for cold-welding such as those shapes previously described.

Similar to the heat sink assembly 100 of FIG. 1, the heat sink assembly 200 provides optimal thermal bonding between each fin and the heat sink base at a first fin end/slot sidewall interface while providing a sufficient mechanical engagement (cold weld) at the opposing fin end/slot sidewall interface. However, the heat sink assembly 200 comprises the double fin 230 where the fins 240 and 250 are each cold-welded and thermally bonded to the slots 212 and 222, respectively.

Optionally, the heat sink fins 240 and 250 can further comprise one or more surface features such as the protrusion 280 for increasing the surface area of each fin. The surface features can be of the kind previously described. Additionally, as previously described and in accordance with FIG. 1, one or both of the sidewalls of each slot 212 and 222 can be formed perpendicular to the base 210 or can be tapered. To ensure proper forcible insertion of the fins 240 and 250 into the slots 212 and 222, respectively, the corresponding surfaces of the fin ends 242 and 252 are configured at angles substantially equivalent to the sidewall angles as previously described. Optionally, the double fin 230 may further comprise a mechanical stop 260 for limiting insertion depth of the fins 240 and 250 as previously described. Also optionally, the double fin 230 may further comprise one or more connectors such as the connectors 272 and 274 for rigidly coupling the fin 240 and the fin 250. Preferably, the connectors are formed in accordance with an extruded aluminum alloy process.

Figure 4:
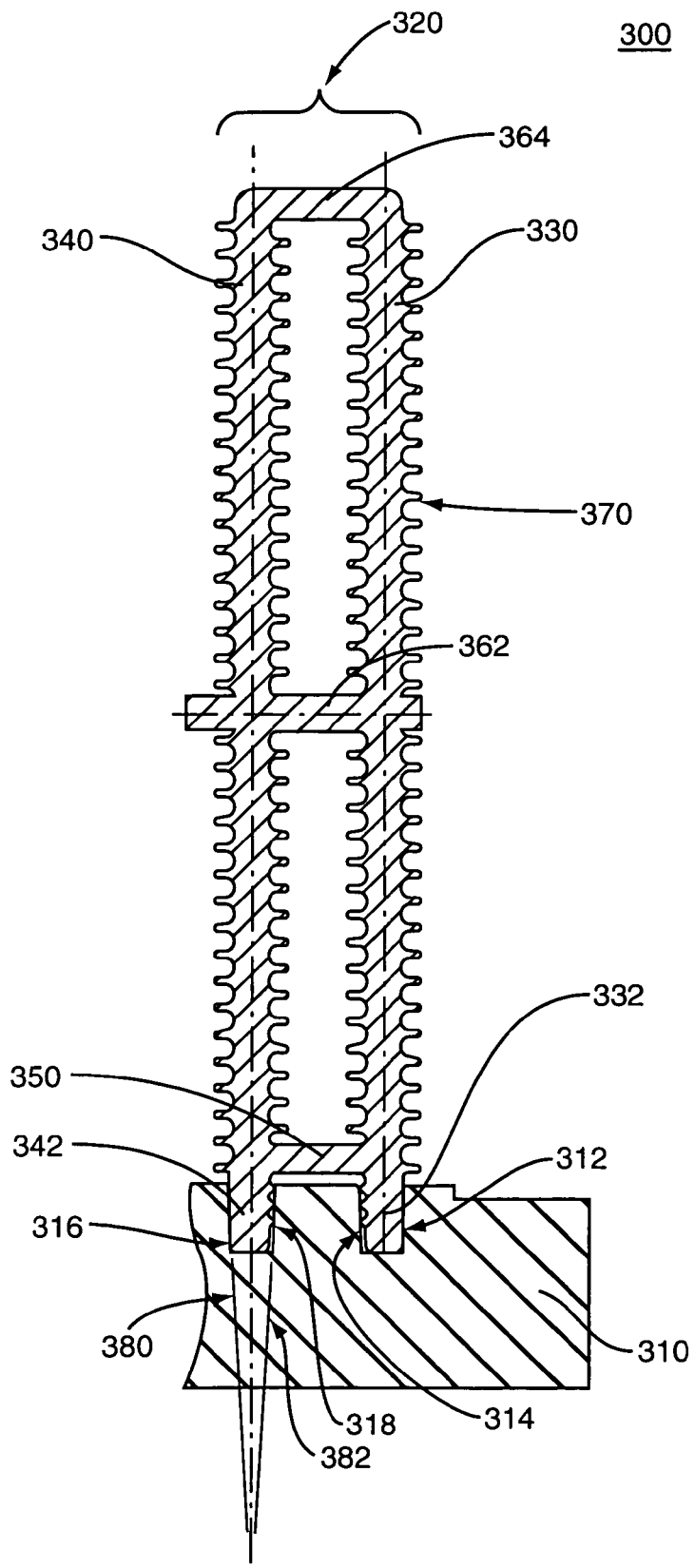
FIG. 4 is a diagram of one embodiment of a heat sink.

FIG. 4 illustrates a partial cross-sectional view of a heat sink embodiment. The heat sink 300 is the result of applying the assembly method embodiment as previously described and in accordance with FIG. 2 to the heat sink assembly 200 of FIG. 3. The heat sink 300 comprises a base 310 and a double fin 320. The double fin 320 comprises a first heat sink fin 330 and a second heat sink fin 340. The fins 330 and 340 are each thermally bonded and cold-welded to the base 310 as previously described.

The first fin 330 includes an end 332. The fin end 332 is thermally bonded to the base 310 via the fin end/sidewall interface 312 as previously described. Additionally, the fin end 332 is cold-welded to the base 310 via the fin end/sidewall interface 314 also as previously described. Likewise, the second fin 340 includes an end 342. The fin end 342 is thermally bonded to the base 310 via the fin end/sidewall interface 316 and cold-welded to the base 310 via the fin end/sidewall interface 318, both as previously described.

Optionally, the double fin 320 may further comprise a mechanical stop 350 for limiting the insertion depth of the fins 330 and 340 as previously described. Furthermore, the double fin 320 may further comprise one or more connectors such as the connectors 362 and 364 for rigidly coupling the fins 330 and 340. Preferably, the connectors are formed in accordance with an extruded aluminum alloy process. Additionally, the fins 330 and 340 can further comprise one or more surface features such as the protrusion 370 for increasing the surface area of each fin. The surface features can be of the kind previously described. Additionally, as previously described and in accordance with FIG. 1, one or both of the sidewalls of each slot can be perpendicular to the base or can be tapered. To ensure proper forcible insertion of the fins 330 and 340 into the base 310, the corresponding surfaces of the fin ends 332 and 342 are configured at angles substantially equivalent to the sidewall angles as previously described. For example, the first surface of the fin end 342 is configured at an angle substantially equivalent to the angle 380 and the second surface of the fin end 342 is configured at an angle substantially equivalent to the angle 382.

Figure 5:
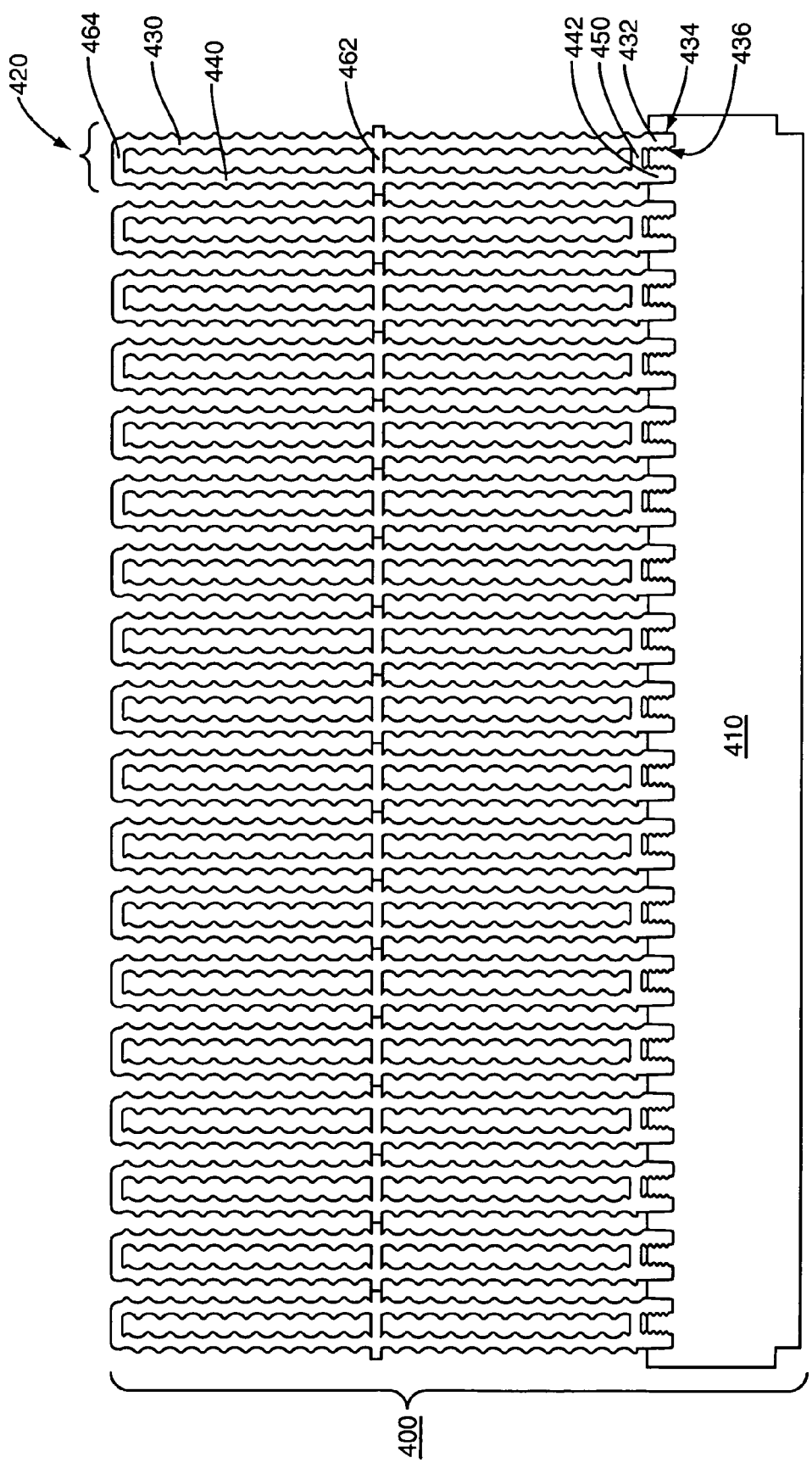
FIG. 5 is a diagram of another embodiment of a heat sink.

FIG. 5 illustrates a cross-sectional view of an alternative heat sink embodiment. The heat sink 400 is the result of applying the assembly method embodiment as previously described to multiple double fin heat sink assemblies, for example, the heat sink assembly 200 of FIG. 3. The heat sink 400 comprises a base 410 and a plurality of double fins such as the double fin 420. The double fin 420 comprises a first heat sink fin 430 and a second heat sink fin 440. The fins 430 and 440 are each thermally bonded and cold-welded to the base 410 as previously described. For example, the first fin 430 includes an end 432. The fin end 432 is thermally bonded to the base 410 via the fin end/sidewall interface 434 as previously described. Additionally, the fin end 432 is cold-welded to the base 410 via the fin end/sidewall interface 436 also as previously described. Likewise, the second fin 440 includes an end 442 which is similarly thermally bonded and cold-welded to the base 410.

Figure 6:
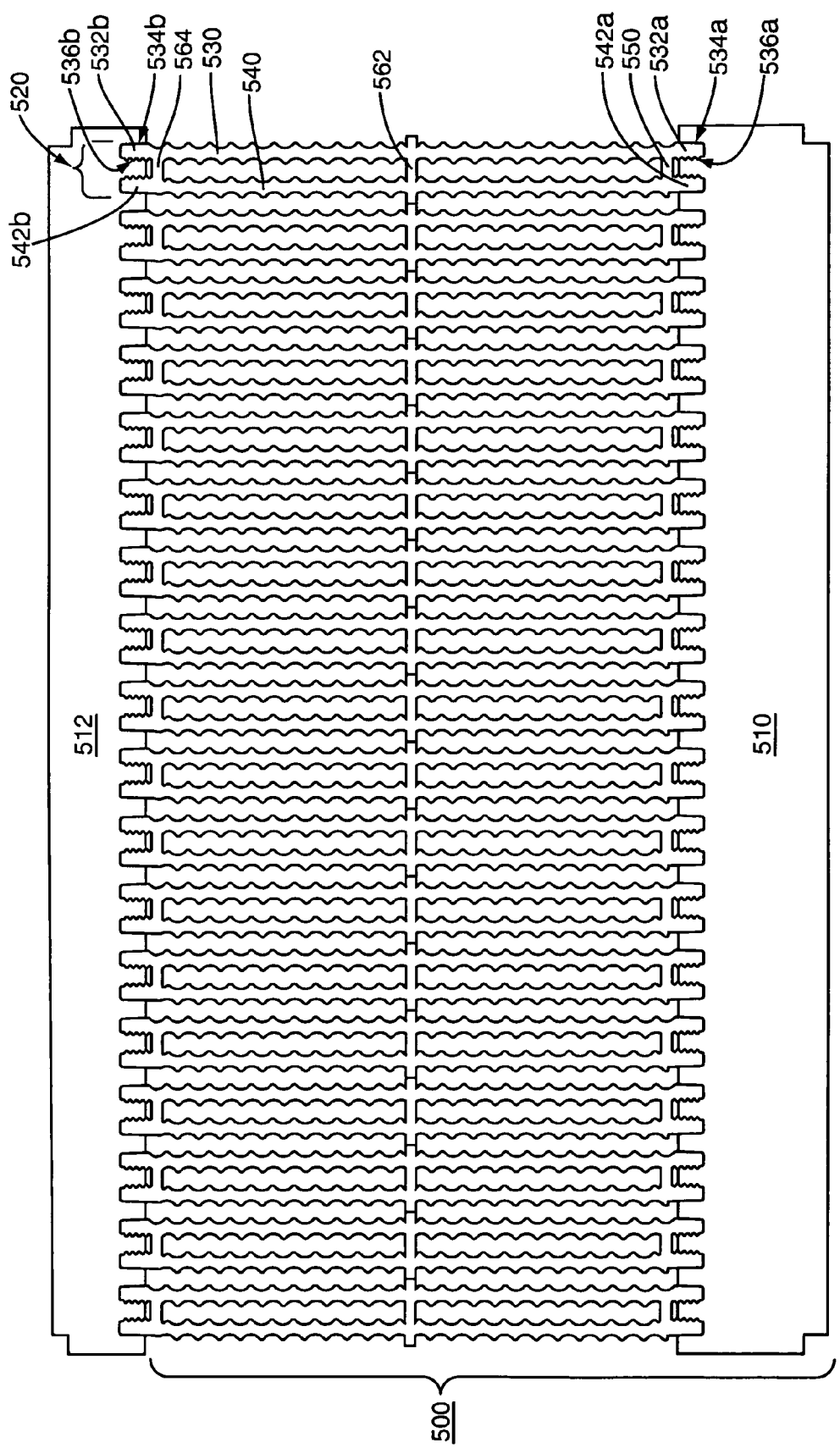
FIG. 6 is a diagram of another embodiment of a heat sink.

FIG. 6 illustrates a cross-sectional view of an alternative heat sink embodiment. The heat sink 500 is similar to the heat sink 400 of FIG. 5, except that the heat sink 500 further comprises a second base 512 opposite a first base 510 and a plurality of double fins such as the double fin 520 interposed between the first and second bases.

The double fin 520 comprises a first fin 530 and a second fin 540. The fins 530 and 540 are each thermally bonded and cold-welded to the first base 510 as previously described. Additionally, the fins 530 and 540 are also each thermally bonded and cold-welded to the second base 512 as previously described. For example, the first fin 530 includes a first end 532a and a second end 532b. The first fin end 532a is thermally bonded to the first base 510 via the fin end/sidewall interface 534a and cold-welded to the first base via the fin end/sidewall interface 536a, both as previously described. The second fin end 532b is thermally bonded to the second base 512 via the fin end/sidewall interface 534b and cold-welded to the second base via the fin end/sidewall interface 536b, both as previously described. Likewise, the second fin 540 includes a first end 542a which is similarly thermally bonded and cold-welded to the first base 510 and a second end 542b which is similarly thermally bonded and cold-welded to the second base 512.

Figure 7:
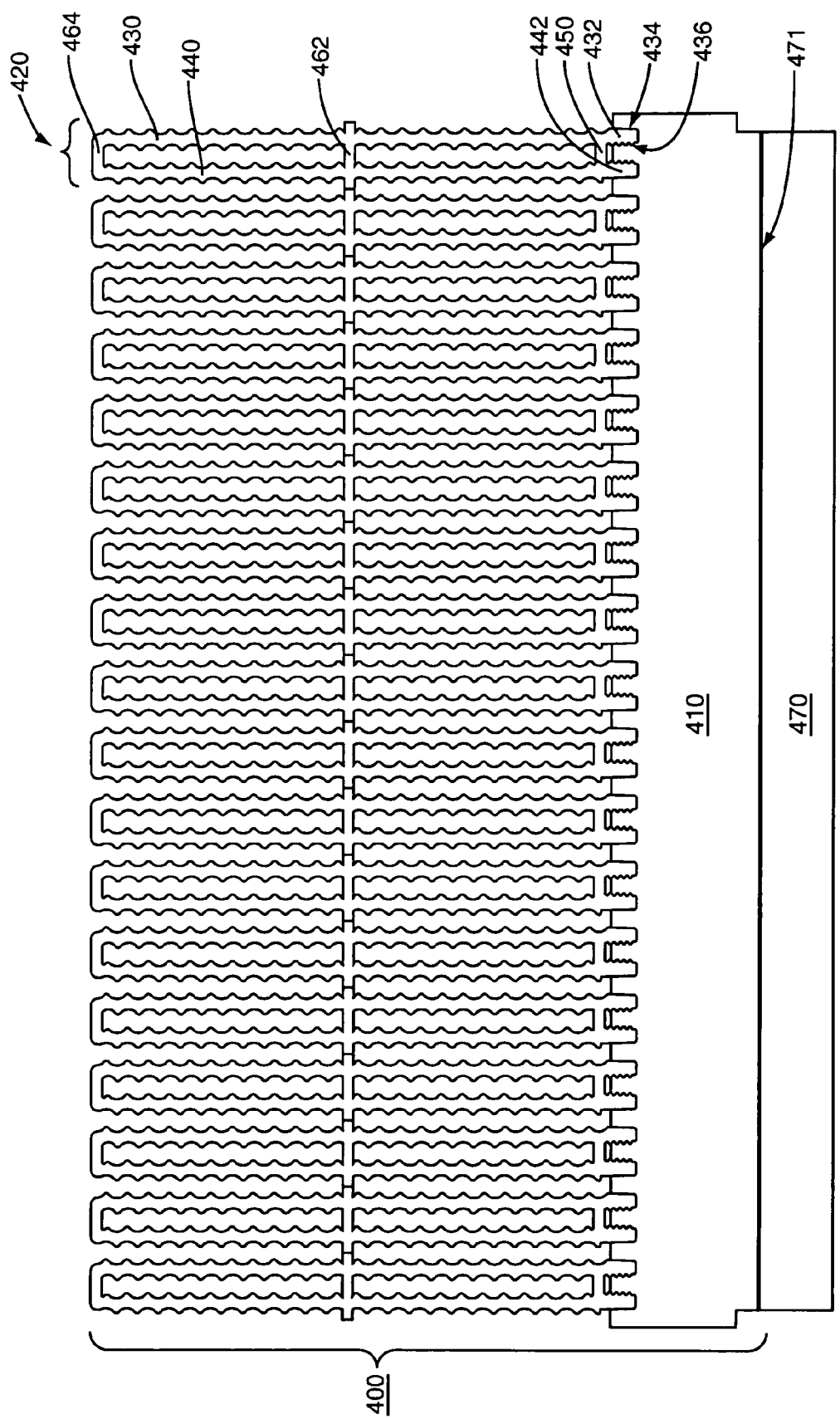
FIG. 7 is a diagram of another embodiment of a heat sink.

FIG. 7 illustrates a cross-sectional view of another alternative heat sink embodiment having an electronic component thermally coupled thereto. The heat sink 400 further comprises an electronic component 470 thermally coupled to a lower surface 471 of the base 410. The electronic component 470 may be any electronic device or devices. For example, the electronic component 470 may be any semiconductor device such as a microprocessor, laser, power electronics device such as an insulated gate bipolar transistor (IGBT), charge-coupled device, memory device, or the like, or any combination thereof such as a system on chip having multiple electronic components. The electronic component 470 may be thermally coupled to the base 410 using any suitable mechanical fastener such as a screw, bolt, clamp, glue or the like.

Figure 8:
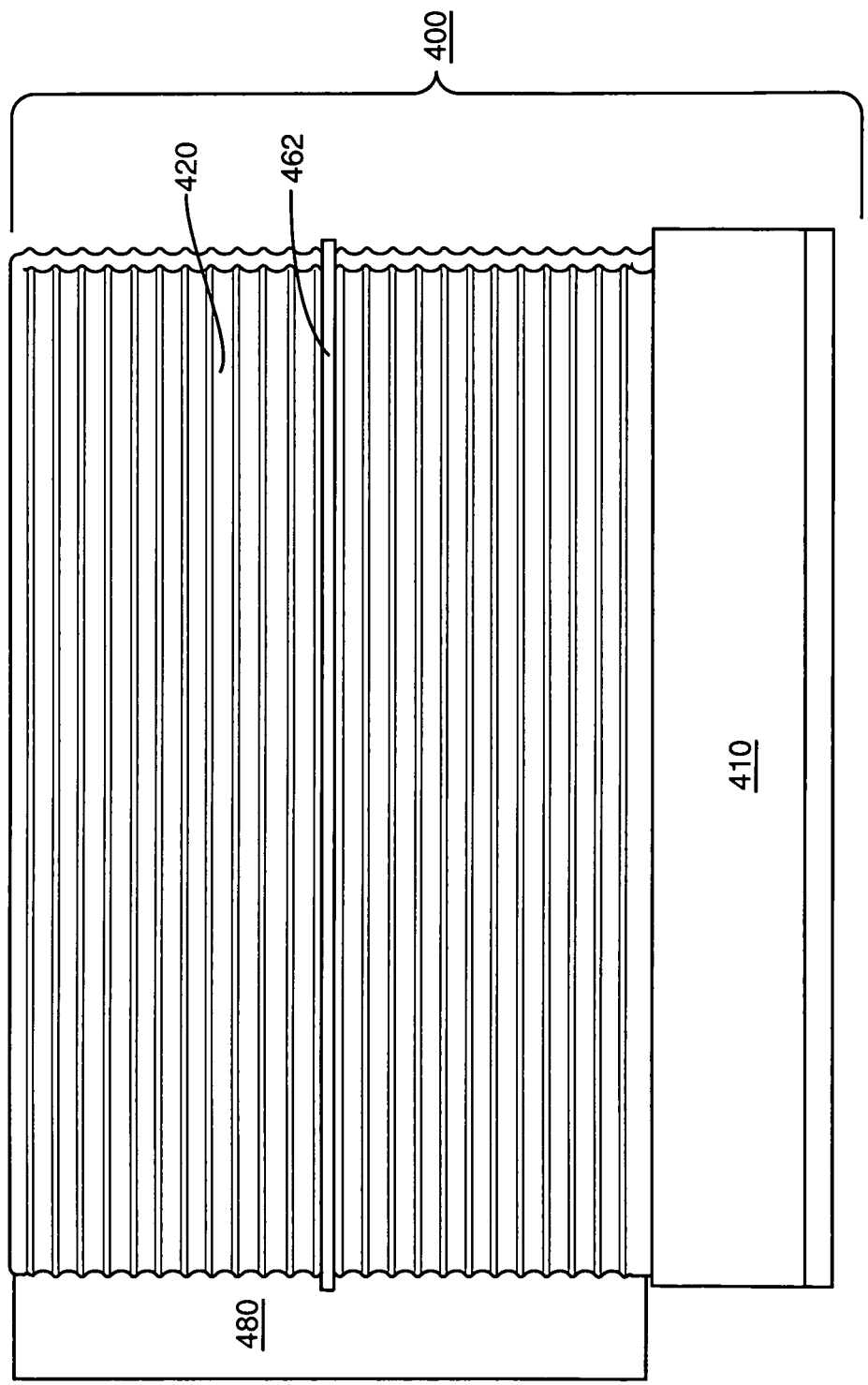
FIG. 8 is a diagram of another embodiment of a heat sink.

FIG. 8 illustrates a side view of the heat sink 400 having a fan 480 coupled to the air inlet side of its heat sink fins 420. The fan 480 may be coupled to the base 410 using any suitable mechanical fastener such as a screw, bolt, clamp, glue or the like. Regardless, with the fan 480 coupled to one side of the heat sink 400, referred to as the "air inlet side," the fan 480 forces air across the length of the fins 420, with the forced air exhausting at the air outlet side (opposite the air inlet side).

Figure 9:
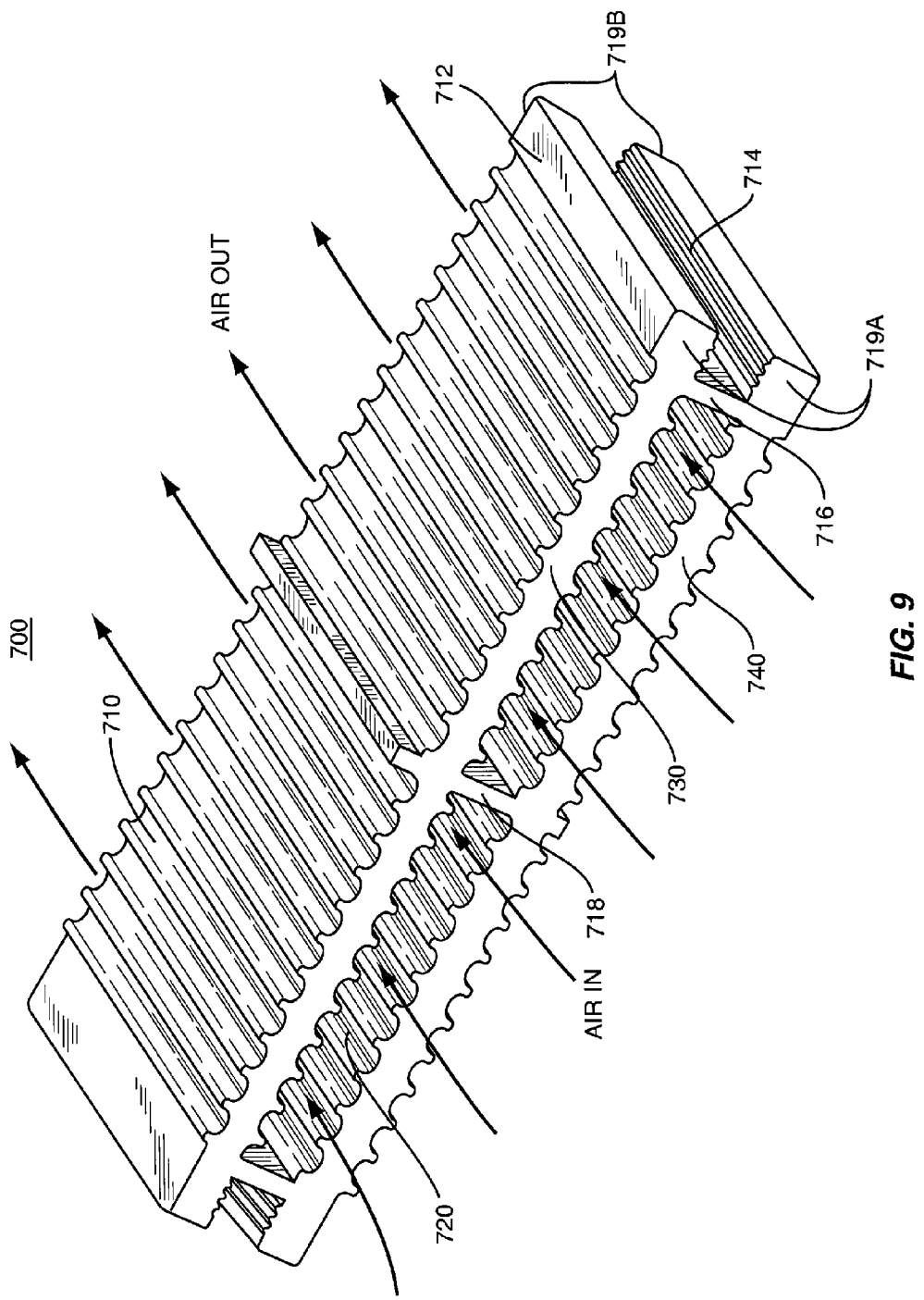
FIG. 9 is a diagram of another embodiment of a heat sink.

Forced air flow may be improved by beveling the leading edges 719A of the fins 420 at the air inlet side and/or by beveling the trailing edges 719B of the fins 420 at the air outlet side. FIG. 9 illustrates such beveling for leading fin edges 719A. Angling the leading fin edges 719A reduces air inlet pressure drop for forced air directed edgewise over the fins. That is, the leading fin edges 719A of the plurality of heat sink fins 700 extend upwardly from the base to collectively form an air inlet surface and angling the leading fin edges 719A reduces air inlet pressure drop.

The heat sink fin 700 comprises a first fin 710 and a second fin 720. The first and second fins 710 and 720 are of the kind as previously described such that each fin includes at least one end having a first surface for thermally bonding to a heat sink base (not shown) and a second surface for cold-welding to the heat sink base. For example, the first fin 710 includes an end 712 and the second fin 720 includes an end 714. Optionally, the heat sink fin 700 may further comprise a mechanical stop 716 for limiting insertion depth of the fins as previously described. Additionally, the first and second fins 710 and 720 may be rigidly coupled by one or more connectors such as the connector 718.

The angled air inlet surface is formed by the edges of adjacent fins upon which ingress air flow impinges. For example, the angled air inlet surface of the heat sink fin 700 is formed by the edges of the first fin 710 and the second fin 720. More specifically, the edge 730 of the first fin 710 and the edge 740 of the second fin 720 form the air inlet surface of the heat sink fin 700. The heat transfer characteristics of the heat sink fin 700 are improved by configuring the air inlet surface at an angle acute to the ingress air flow. Preferably, the leading fin edge 719A bevel is formed at approximately 30 to 60 degrees acute with respect to the ingress air flow. By beveling the leading fin edges 719A, air turbulence at the air inlet of the heat sink fin 700 is decreased, thus decreasing the air pressure drop at the inlet. The reduced pressure drop improves the overall ability of the heat sink fin 700 to dissipate heat from an electronic component (not shown) to which the heat sink is thermally coupled.

Additionally or alternatively, the air outlet surface (not shown) of the heat sink fin 700 formed by the trailing edges 719B of the plurality of heat sink fins 700 may be similarly configured. That is, the trailing edges 719B of the fins 700 may be beveled to reduce turbulence at the air outlet. Preferably, the trailing fin edges 719B are beveled at an angle in the approximate range of 30 to 60 degrees acute with respect to the egress air flow.

Figure 10:
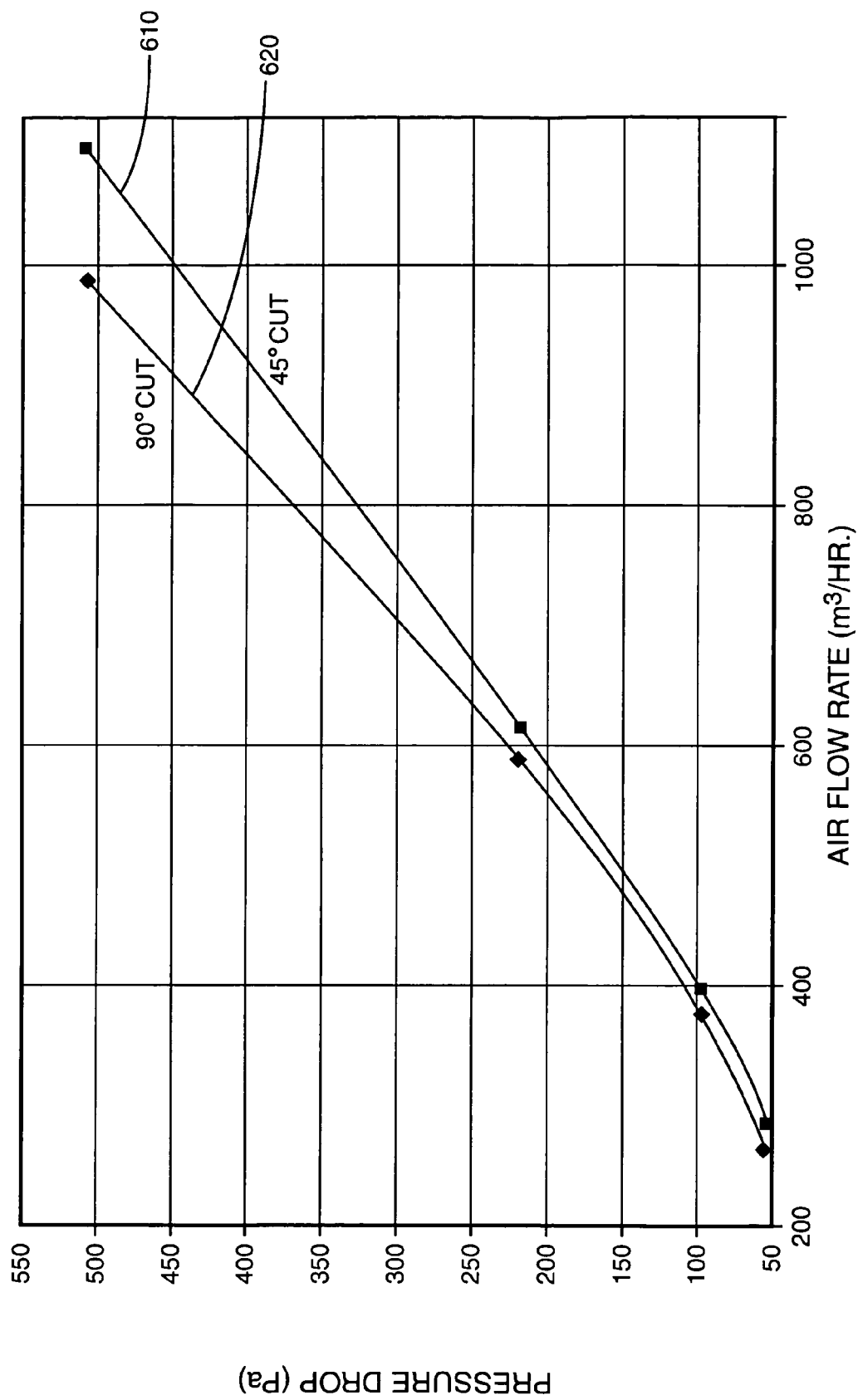
FIG. 10 is a graph illustrating the effect air inlet surface angle has on pressure drop.

FIG. 10 illustrates the pressure drop effect of beveling leading fin edges at the air inlet surface angle. The y-axis represents pressure drop measured in Pascals and the x-axis represents inlet air flow rate measured in $m^3$/hr. The curve 610 represents the pressure drop to air flow relationship for leading fin edges beveled at 45 degree angles. The curve 620 represents the pressure drop to air flow relationship for non-beveled fin edges (i.e., 90 degree edge surfaces). As seen in the illustration, the beveled edges yield an approximately a 14 percent or greater pressure drop improvement as compared to the non-beveled edges for high inlet air flow rates. This improvement in pressure drop translates directly to improved heat transfer characteristics of the heat sink.

The several embodiments described herein teach a heat sink assembly, heat sink and method of assembling a heat sink having improved thermal bonding between the heat sink fin (s) and the heat sink base(s) while maintaining sufficient mechanical fastening between the fin(s) and base(s). The several embodiments described herein teach single-fin, double-fin, multi-fin, single-base and double-base heat sink configurations. Additionally, the several embodiments described herein teach the coupling of an electronic component to the heat sink for cooling of the component and the coupling of a fan to the heat sink for improved thermal dissipation.

While the invention has been described in terms of specific embodiments, it should be understood that the present invention is not limited by the foregoing description, nor is it limited by the accompanying drawings. Instead, the present invention is limited only by the following claims and their legal equivalents.

What is claimed is:
1. A heat sink, comprising:
a base having a slot, the slot having first and second sidewalls;
a fin having an end press-fitted into the slot, the fin end comprising a first surface conformally engaged with the first sidewall and a second surface having one or more protrusions cold-welded to the second sidewall, said one or more protrusions extending laterally along a length of the second surface.
2. The heat sink of claim 1, wherein the base includes a plurality of slots and the heat sink further comprises a corresponding plurality of fins pressed into respective ones of the slots, and wherein the fins extend substantially perpendicularly away from a surface of the base in which the plurality of slots are formed.

3. The heat sink of claim 2, wherein leading edges of the fins form an air inlet surface and are beveled to improve air flow directed across the fins.

4. The heat sink of claim 2, wherein trailing edges of the fins form an air outlet surface and are beveled to improve air flow directed across the fins.

5. The heat sink of claim 1, wherein at least one of the first and second sidewalls is tapered.

6. The heat sink of claim 5, wherein the second sidewall is tapered in a range of about two to five degrees.

7. The heat sink of claim 5, wherein the first and second sidewalls are tapered in a range of about two to five degrees.

8. A heat sink assembly, comprising:
a base having a slot, the slot having first and second sidewalls;
a fin having an end adapted for insertion in the slot, the fin end comprising a first surface configured to conformally engage the first sidewall during insertion for thermal bonding and a second surface having one or more protrusions that extend laterally along a length of the second surface and are configured to cold-weld to the second sidewall during insertion for mechanical fastening.

9. The heat sink assembly of claim 8, wherein at least one of the first and second sidewalls is tapered.

10. The heat sink assembly of claim 9, wherein the second sidewall is tapered in a range of about two to five degrees.

11. The heat sink assembly of claim 9, wherein the first and second sidewalls are tapered in a range of about two to five degrees.

12. The heat sink assembly of claim 8, wherein a leading edge of the fin is beveled to reduce pressure drop in airflow directed edgewise over the fin.

13. The heat sink assembly of claim 8, wherein a trailing edge of the fin is beveled to reduce pressure drop in airflow directed edgewise over the fin.

14. The heat sink assembly of claim 8, wherein the fin includes a mechanical stop configured to limit an insertion depth of the fin end into the slot.

15. The heat sink assembly of claim 8, further comprising a second slot in the base and a corresponding second fin for insertion therein, said second fin rigidly coupled to the first fin by at least one connector.

16. The heat sink assembly of claim 15, wherein the first and second fins and the at least one connector comprise an integral extrusion.

17. The heat sink assembly of claim 16, wherein the first and second fins comprise parallel, spaced-apart fins joined together via the at least one connector.

18. The heat sink assembly of claim 8, further comprising a second base having a second slot, and wherein the fin further comprises a second fin end that is opposite the first fin end and configured for insertion into the second slot.

19. The heat sink assembly of claim 18, wherein the fin further comprises a first mechanical stop at the first fin end to limit an insertion depth of the first fin end into the first slot and a second mechanical stop at the second fin end to limit an insertion depth of the second fin end into the second slot.

20. The heat sink assembly of claim 8, wherein a body of the fin extending from the fin end includes surface features configured to increase heat dissipation of the fin.

21. The heat sink assembly of claim 8, wherein the heat sink is made from an aluminum alloy.

* * * * *